(12) United States Patent
Sano (10) Patent No.: US 6,483,141 B2
(45) Date of Patent: *Nov. 19, 2002

(54) SEMICONDUCTOR MEMORY DEVICE AND MANUFACTURING METHOD THEREOF

(75) Inventor: Michiaki Sano, Yamanashi (JP)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/386,121

(22) Filed: Aug. 30, 1999

(65) Prior Publication Data

US 2002/0058379 A1 May 16, 2002

(30) Foreign Application Priority Data

Aug. 31, 1998 (JP) .............................................. 10-260968

(51) Int. Cl.[7] .......................................... H01L 21/8242
(52) U.S. Cl. ....................................... 257/306; 257/307
(58) Field of Search .............................. 438/3, 238–241, 438/253–256, 381, 396–399; 257/295–296, 303–310

(56) References Cited

U.S. PATENT DOCUMENTS

| 5,492,850 | A | * | 2/1996 | Ryou |
| 5,668,412 | A | * | 9/1997 | Kim |
| 5,869,861 | A | * | 2/1999 | Chen |
| 5,923,973 | A | * | 7/1999 | Chen et al. .................. 438/255 |

* cited by examiner

Primary Examiner—Jey Tsai
(74) Attorney, Agent, or Firm—Pedro P. Hernandez; W. James Brady III; Frederick J. Telecky, Jr.

(57) ABSTRACT

In a DRAM with a COB (capacitor over bitline) structure where one side of the storage node is approximately equal to the diameter of the contact plug, when the mask is mispositioned when the storage node is formed, to prevent the underlying oxide film from being exposed at the side surface of the contact hole and to prevent that underlying oxide film from being inadvertently etched during wet etching. Contact plug 7 is formed with oxide film 20 attached on nitride film 5, that acts as an etching stopper during wet etching. By doing this, contact plug 7 is formed projecting upward above underlying oxide film 4 and preferably projecting above nitride film 5. After storage node 10 is formed, when oxide films 8 and 20 are removed by wet etching, underlying oxide film 4 is not exposed at the side surface of contact hole 6 and inadvertent etching of it can be prevented.

14 Claims, 13 Drawing Sheets

SEMICONDUCTOR MEMORY DEVICE AND MANUFACTURING METHOD THEREOF

FIELD OF THE INVENTION

This invention pertains to a semiconductor memory device, e.g., a DRAM (dynamic random access memory) and to a manufacturing method therefor.

BACKGROUND OF THE INVENTION

For example, with recent DRAMs, various memory capacitor structures have been proposed to maintain the required cell capacitor capacity while reducing the base area of the memory cell capacitor.

Referring to FIGS. 10–14, cross sections of a conventional memory cell transistor section and drain diffusion section are shown, and the manufacturing method therefor will be explained.

Figure 10A:
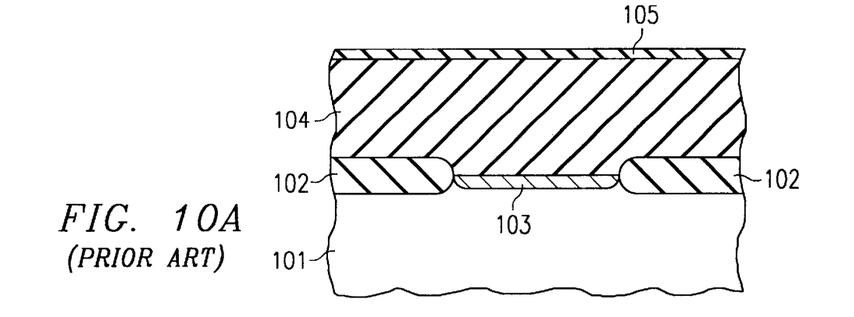
FIGS. 10a–10b are schematic cross section showing the manufacturing method, in process sequence, for a conventional DRAM memory capacitor.

First, as shown in FIG. 10a, for example, elements are separated by field oxide film 102, silicon oxide ($SiO_2$) film 104 is formed, as an inter-layer insulating film, over the entire surface of silicon semiconductor substrate 101, on which is formed an access transistor structure, which includes impurity diffusion layer 103, and others, and silicon nitride ($Si_3N_4$) film 105 is further formed on that.

Figure 10B:
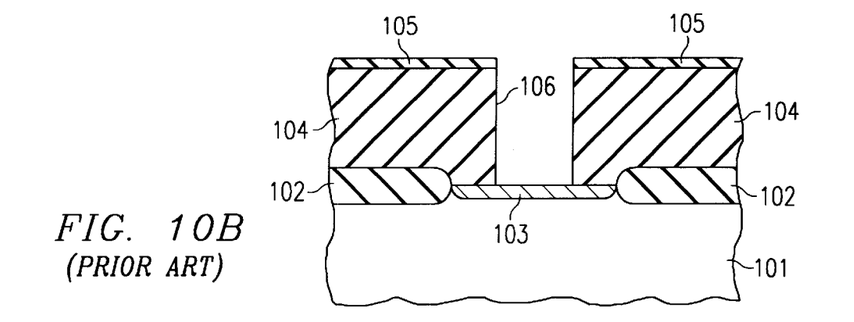

Next, as shown in FIG. 10b, contact hole 106 that reaches impurity diffusion layer 103 is formed in silicon nitride film 105 and silicon oxide film 104.

Figure 11A:
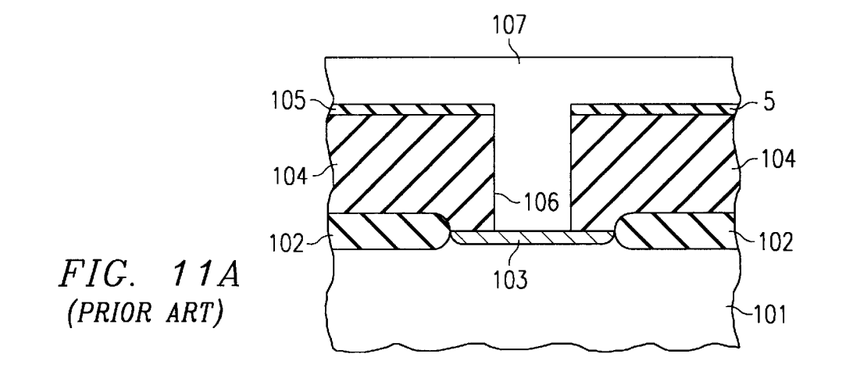
FIGS. 11a–11b are schematic cross section showing the manufacturing method, in process sequence, for a conventional DRAM memory capacitor.

Next, as shown in FIG. 11a, low-resistance polysilicon film 107 is formed over the entire surface to bury contact hole 106.

Figure 11B:
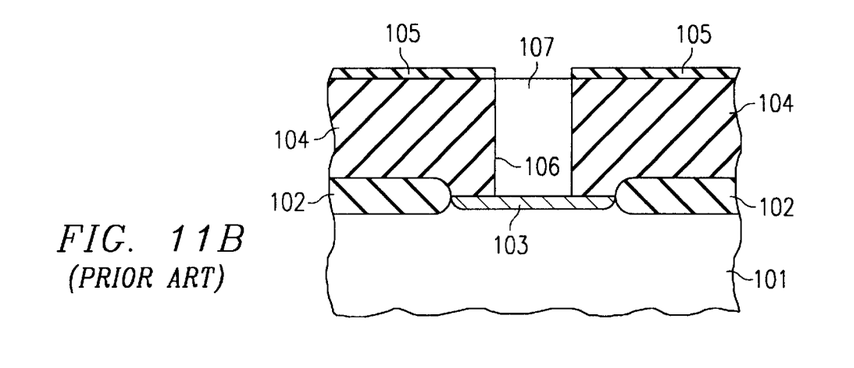

Next, as shown in FIG. 11b, polysilicon film 107 is etched back, removing all of polysilicon film 107 on silicon nitride film 105 outside of contact hole 106 and leaving contact plug 107 made of this low-resistance polysilicon only in contact hole 106. At this time, to essentially completely remove polysilicon film 107 on silicon nitride film 105, some overetching is applied. Thus, as shown, contact plug 107 is formed slightly depressed from the top edge of contact hole 106.

Figure 12A:
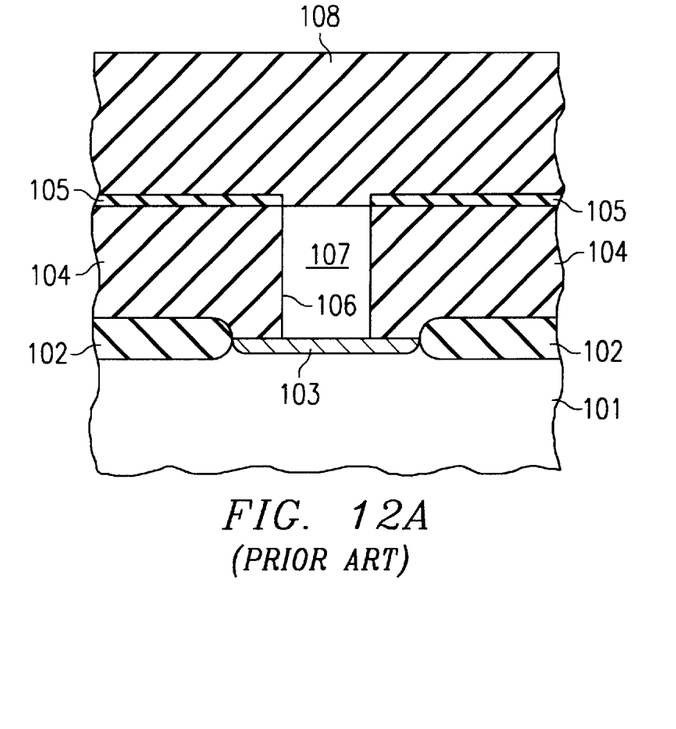
FIGS. 12a–12b are schematic cross section showing the manufacturing method, in process sequence, for a conventional DRAM memory capacitor.

Next, as shown in FIG. 12a, silicon oxide film 108 is formed over the entire surface.

Figure 12B:
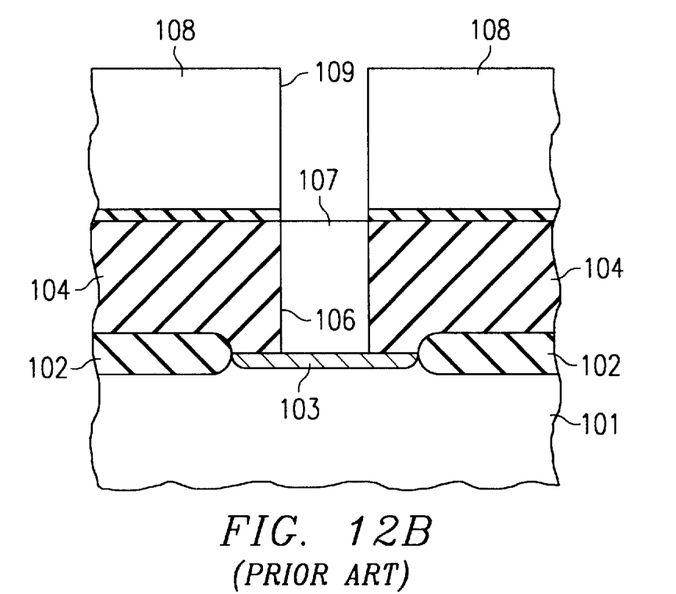

Next, as shown in FIG. 12b, silicon oxide film 108 is anisotropically etched to form through-hole 109 that reaches contact plug 107.

Figure 13A:
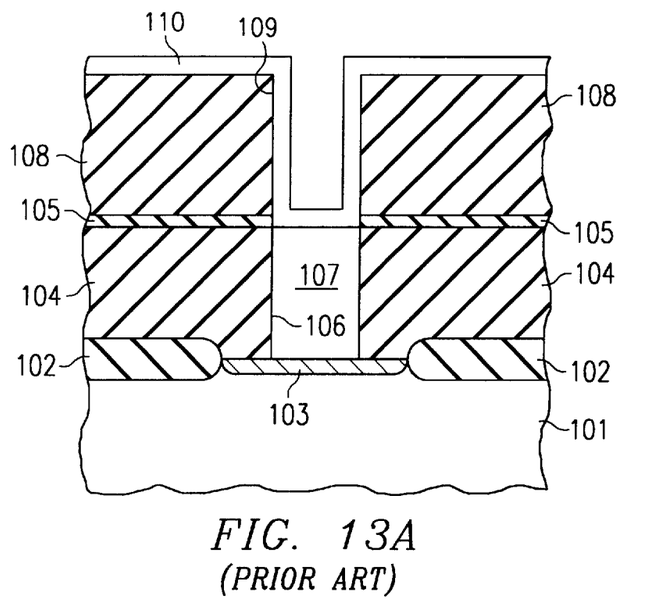
FIGS. 13a–13b are schematic cross section showing the manufacturing method, in process sequence, for a conventional DRAM memory capacitor.

Next, as shown in FIG. 13a, low-resistance polysilicon film 110 is formed over the entire surface, including the inner surface of through-hole 109.

Figure 13B:
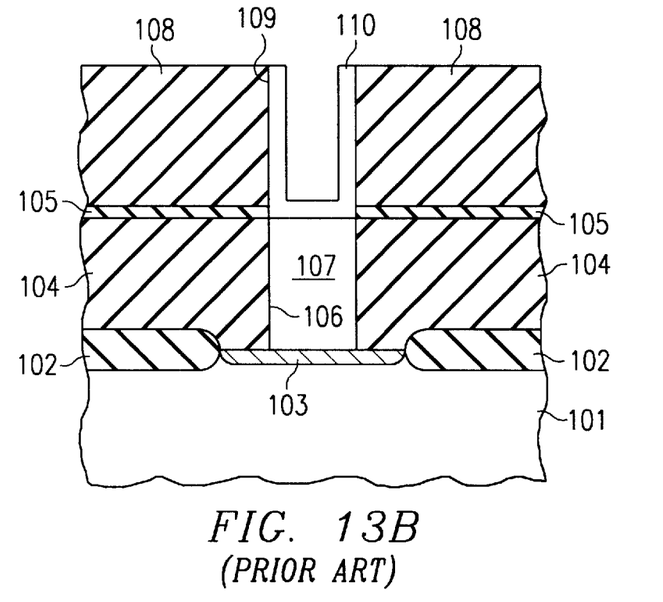

Next, as shown in FIG. 13b, polysilicon film 110 is etched back, essentially removing all of polysilicon film 110 on silicon oxide film 108 outside of through-hole 109. By doing this, memory capacitor crown-type lower electrode (storage node) 110, made of this low-resistance polysilicon, is formed in through-hole 109.

Figure 14A:
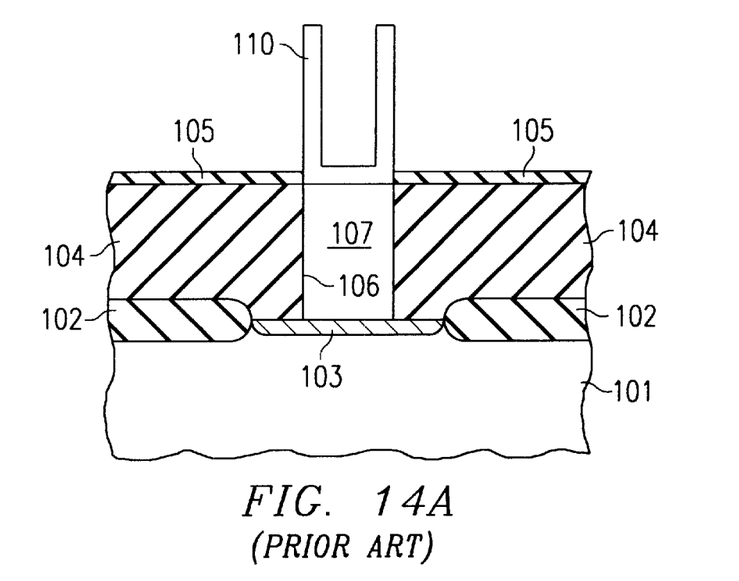
FIGS. 14a–14b are schematic cross section showing the manufacturing method, in process sequence, for a conventional DRAM memory capacitor.

Next, as shown in FIG. 14a, silicon oxide film 108 is essentially entirely removed by wet etching using an aqueous solution of HF. At this time, silicon nitride film 105 functions as an etching stopper.

Figure 14B:
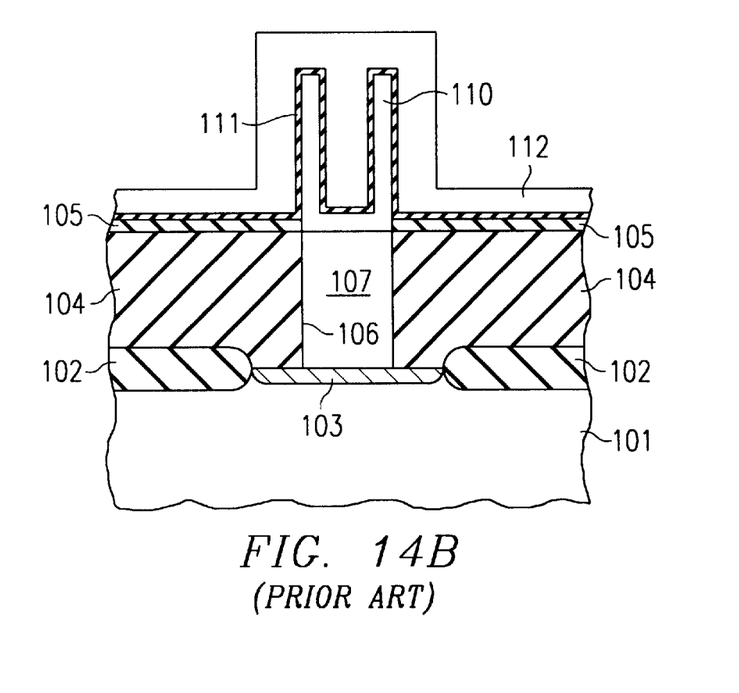

Next, as shown in FIG. 14b, capacitor dielectric film 111, composed of, for example, a stacked film of a silicon nitride film and a silicon oxide film (NO composite film), or another high dielectric material, for example, tantalum oxide ($Ta_2O_5$), barium strontium titanate (BST), lead zirconate titanate (PZT), etc., is formed to cover the surface of storage node 110, and memory capacitor upper electrode (cell plate) 112, made of a low-resistance polysilicon film, is further formed on that.

A crown-type memory capacitor structure is formed using the above processes.

In recent DRAMs, the length of one side of storage node 110, laterally or longitudinally, has approached approximately the diameter of contact plug 107, to decrease cell size smaller. For this reason, one side of through-hole 109 formed in the process in FIG. 12b is approximately equal to the diameter of contact plug 107, that is, the diameter of contact hole 106. In addition, because of problems with bit line and storage node electric capacitance, silicon nitride film 105 cannot be thickened.

Figure 15A:
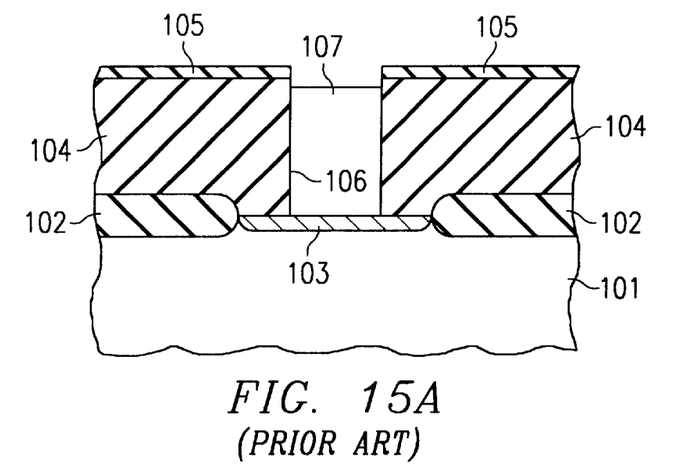
FIGS. 15a–15b are schematic cross section showing conventional problems.

With the conventional manufacturing method discussed above, when contact plug 107 is formed with the process shown in FIG. 11b, it is over-etched, so contact plug 107 is depressed approximately 100 nm from the top edge of contact hole 106. For this reason, as shown in FIG. 15a, contact plug 107 is depressed below silicon nitride film 105, and silicon oxide film 104 is exposed at the side of contact hole 106.

Figure 15B:
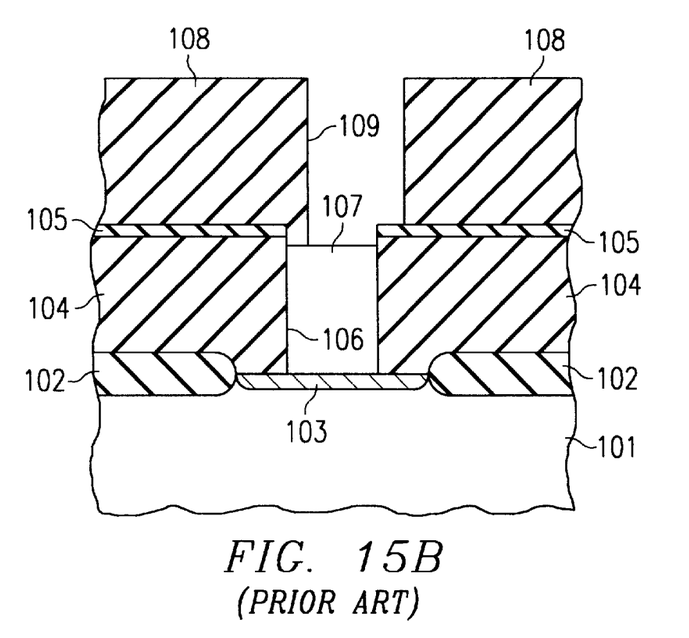
Figure 16A:
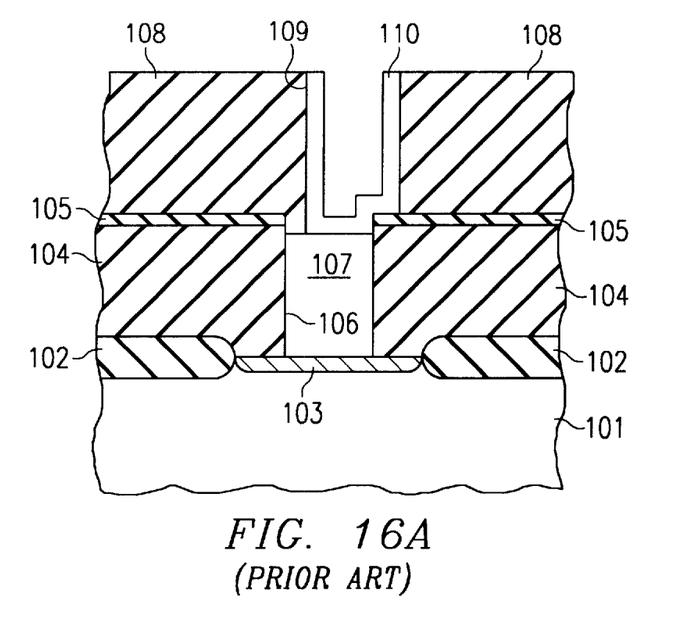
FIGS. 16a–16b are schematic cross section showing conventional problems.
Figure 16B:
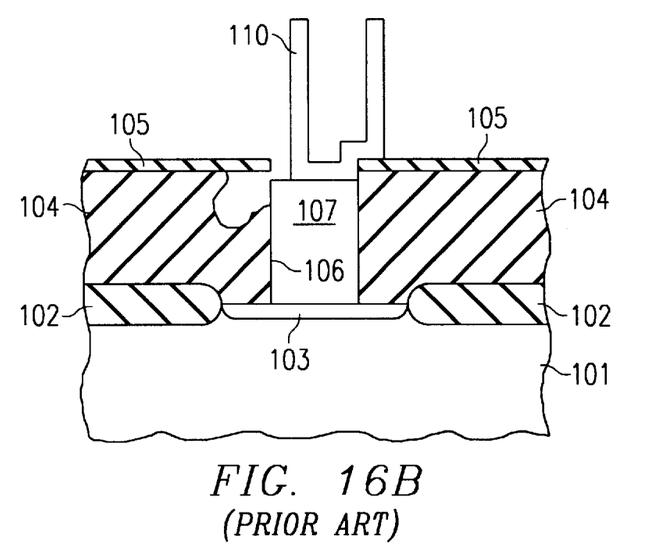

In this state, as shown in FIG. 15b, if the position of through-hole 109 formed in silicon oxide film 108 is off, as shown in FIG. 16a, when silicon oxide film 108 is removed by wet etching after storage node 110 is formed, as shown in FIG. 16b, underlying silicon oxide film 104 is also significantly hollowed out. When upper electrode 112 intrudes into this area, it causes short-circuits and parasitic capacitance.

Because it is impossible to completely eliminate mispositioning of through-hole 109, when one side of storage node 110 is approximately equal to the diameter of contact plug 107, it is extremely difficult to prevent etching of silicon oxide film 104 beneath it.

So the purpose of this invention is to provide a semiconductor memory device with a contact plug structure that prevents inadvertent etching of an underlying silicon oxide film, even when one side of the storage node is approximately equal to the diameter of the contact plug, in a DRAM such as discussed above, for example, and a manufacturing method therefor.

SUMMARY OF THE INVENTION

The semiconductor memory device of this invention, that will solve the aforementioned problems, has a semiconductor substrate provided with an impurity diffusion layer in a prescribed place in the surface region, an insulator layer provided on the aforementioned semiconductor substrate, a contact hole provided in the aforementioned insulator layer in a position on the aforementioned impurity diffusion layer, a contact plug that buries the aforementioned contact hole and that is provided projecting upward above the aforementioned insulator layer, a memory capacitor lower electrode that is provided on the aforementioned insulator layer connected to the aforementioned contact plug, a capacitor dielectric film provided on the surface of the aforementioned lower electrode, and a memory capacitor upper electrode provided on the aforementioned capacitor dielectric film.

With one embodiment of this invention, at least one side of the planar shape of the aforementioned lower electrode is approximately equal to the diameter of the aforementioned contact plug.

With one embodiment of this invention, an indented section is formed in the top surface of the aforementioned lower electrode to constitute a crown-type memory capacitor.

The semiconductor memory device manufacturing method of this invention has a process where a first insulator layer is formed over the entire surface of a semiconductor substrate where an impurity diffusion layer is formed in a prescribed place in the surface region, a process where a second insulator layer is formed over the entire surface of the aforementioned first insulator layer, a process where a third insulator layer is formed over the entire surface of the aforementioned second insulator layer, a process where a contact hole that passes through the aforementioned first through third insulator layers is formed in a position on the aforementioned impurity diffusion layer, a process where a first conductor layer is formed over the entire surface of the aforementioned third insulator layer to bury the aforementioned contact hole, a process where the aforementioned first conductor layer is etched back essentially removing all of the aforementioned first conductor layer on the aforementioned third insulator layer outside the aforementioned contact hole and at the same time leaving the aforementioned first conductor layer projecting upward at least above the aforementioned first insulator layer in the aforementioned contact hole, a process where a fourth insulator layer is formed over the entire surface, including on the aforementioned first conductor layer in the aforementioned contact hole, a process where a through-hole that reaches the aforementioned first conductor layer is formed at least in the aforementioned fourth insulator layer, a process where a second conductor layer is formed over the entire surface including the inner surface of the aforementioned through-hole, a process where the aforementioned second conductor layer is etched back essentially removing all the aforementioned second conductor layer on the aforementioned fourth insulator layer outside the aforementioned through-hole, a process where the aforementioned fourth and third insulator layers are essentially entirely removed, a process where, after the aforementioned fourth and third insulator layers are removed, a fifth insulator layer is formed on the surface of the aforementioned second conductor layer, and a process where a third conductor layer is formed at least on the aforementioned fifth insulator layer.

In addition, the semiconductor memory device manufacturing method based on another embodiment of this invention has a process where a first insulator layer is formed over the entire surface of a semiconductor substrate on which is formed an impurity diffusion layer in a prescribed place in the surface region, a process where a second insulator layer is formed over the entire surface of the aforementioned first insulator layer, a process where a third insulator layer is formed over the entire surface on the aforementioned second insulator layer, a process where a contact hole that passes through the aforementioned first through third isolator layers is formed in a position on the aforementioned impurity diffusion layer, a process where a first conductor layer is formed over the entire surface of the aforementioned third insulator layer to bury the aforementioned contact hole, a process where the aforementioned first conductor layer is etched back essentially entirely removing the aforementioned first conductor layer on the aforementioned third insulator layer outside the aforementioned contact hole while at the same time leaving the aforementioned first conductor layer projecting upward at least above the aforementioned first insulator layer in the aforementioned contact hole, a process where the aforementioned third insulator layer is essentially entirely removed, a process where a fourth insulator layer is formed over the entire surface including the aforementioned first conductor layer, a process where a through-hole that reaches the aforementioned first conductor layer is formed in the aforementioned fourth insulator layer, a process where a second conductor layer is formed over the entire surface including the inner surface of the aforementioned through-hole, a process where the aforementioned second conductor layer is etched back essentially entirely removing the aforementioned second conductor layer on the aforementioned fourth insulator layer outside the aforementioned through-hole, a process where the aforementioned fourth insulator layer is essentially entirely removed, a process where, after the aforementioned fourth insulator layer is removed, a fifth insulator layer is formed on the surface of the aforementioned second conductor layer, and a process where a third conductor layer is formed at least on the aforementioned fifth insulator layer.

In addition, the contact plug structure of this invention is a contact plug for electrically connecting low-resistance layers separated above and below each other with an intervening insulator layer, and the contact plug that is buried in the aforementioned insulator layer is provided projecting upward above the aforementioned insulator layer.

REFERENCE NUMERALS AND SYMBOLS AS SHOWN IN THE DRAWINGS

In the FIGS., 1, 101 represents silicon semiconductor substrate, 2, 102 field oxide film, 3, 103 impurity diffusion layer, 4, 104 silicon oxide film, 5, 105 silicon nitride film, 6, 106 contact hole, 7, 107 polysilicon film (contact plug), 8, 108 silicon oxide film, 9, 109 through-hole, 10, 110 polysilicon film (storage node), 10' storage node, 11, 111 capacitor dielectric film, 12, 112 polysilicon film (cell plate), 20 silicon oxide film, and 21 wiring layer.

DESCRIPTION OF EMBODIMENTS

Below, this invention will be explained with preferred embodiments.

First Embodiment

First, referring to FIGS. 1–5, a first embodiment of this invention will be explained.

Figure 1A:
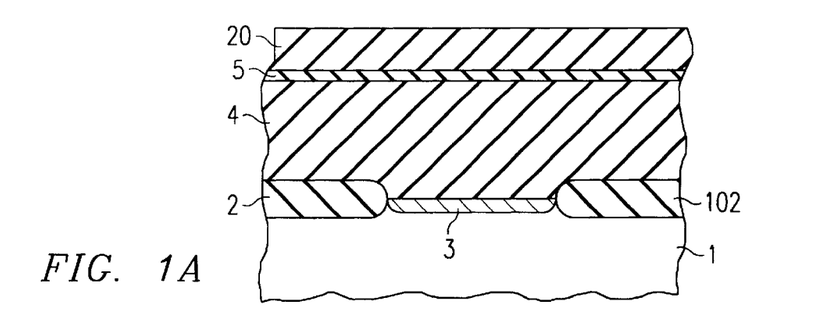
FIGS. 1a–1b are schematic cross section showing the manufacturing method, in process sequence, for a DRAM memory capacitor based on a first embodiment of this invention.

First, as shown in FIG. 1a, elements are separated by field oxide film 2 or STI (shallow trench isolation, not shown), for example, silicon oxide ($SiO_2$) film 4 approximately 700 nm thick is formed as an interlayer insulating film over the entire surface of silicon semiconductor substrate 1, on which is formed an access transistor structure, that includes impurity diffusion layer 3, and others, and silicon nitride ($Si_3N_4$) film 5, approximately 30 nm thick, is further formed on that. Then, with this embodiment of the invention, silicon oxide film 20, approximately 300 nm thick, is further formed on that.

Figure 1B:
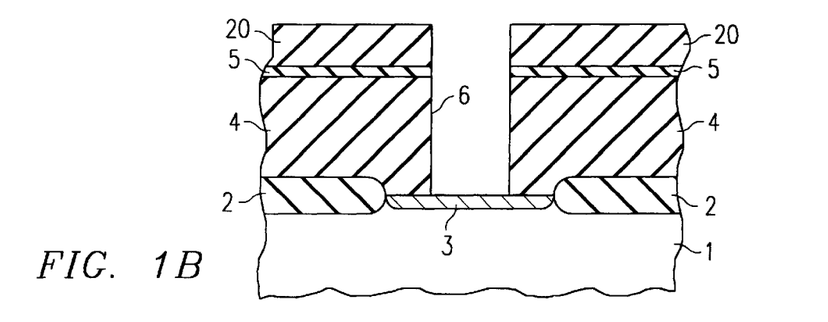

Next, as shown in FIG. 1b, contact hole 6, that reaches impurity diffusion layer 3, is formed in silicon oxide film 20, silicon nitride film 5, and silicon oxide film 4.

Figure 2A:
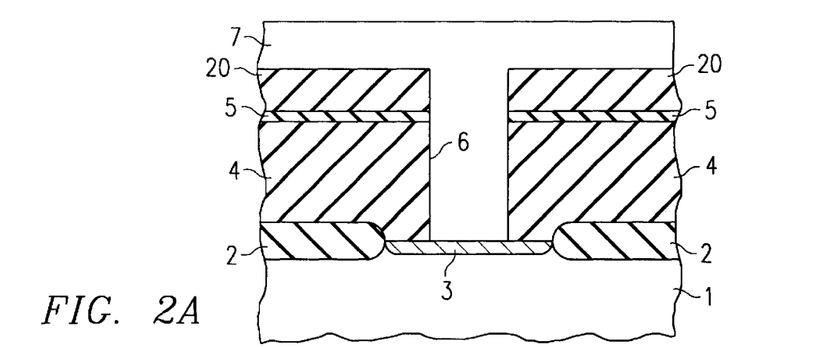
FIGS. 2a–2b are schematic cross section showing the manufacturing method, in process sequence, for a DRAM memory capacitor based on a first embodiment of this invention.

Next, as shown in FIG. 2a, low-resistance polysilicon film 7, approximately 150 nm thick, is formed over the entire surface to bury contact hole 6.

Figure 2B:
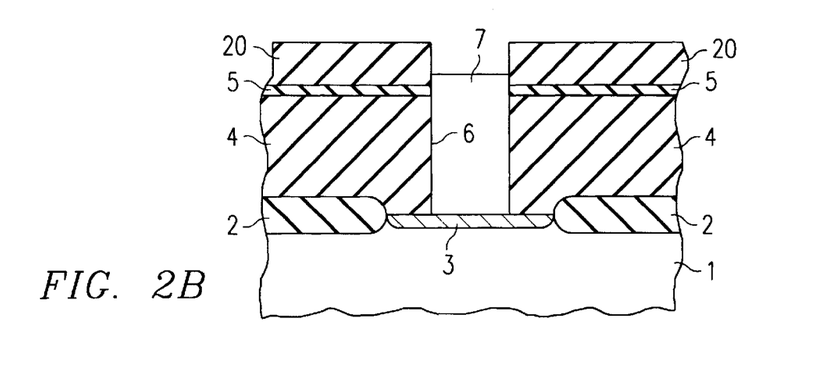

Next, as shown in FIG. 2b, polysilicon film 7 is etched back, removing all of polysilicon film 7 on silicon oxide film 20 outside of contact hole 6 and leaving contact plug 7, made of this low-resistance polysilicon, only in contact hole 6. At this time, polysilicon film 7 on silicon oxide film 20 is essentially completely removed, so it is overetched, but in this embodiment, silicon oxide film 20 is provided. So as shown, contact plug 7 is formed essentially projecting upward above silicon oxide film 4, and preferably projecting upward above silicon nitride film 5 too.

Figure 3A:
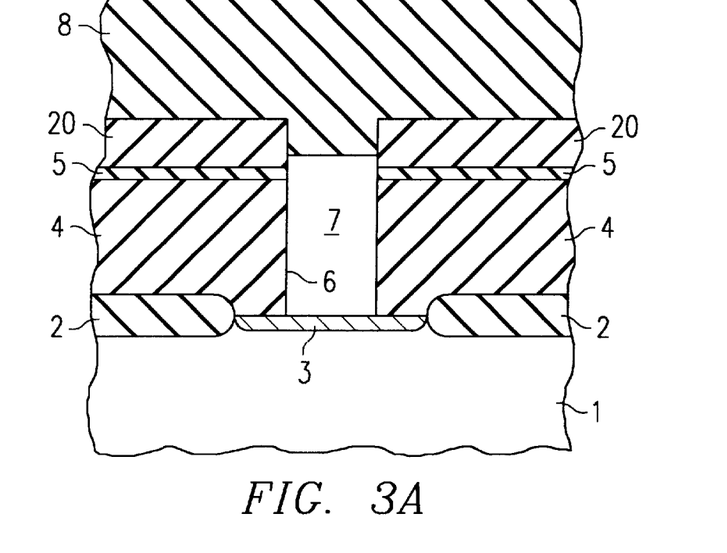
FIGS. 3a–3b are schematic cross section showing the manufacturing method, in process sequence, for a DRAM memory capacitor based on a first embodiment of this invention.

Next, as shown in FIG. 3a, silicon oxide film 8, approximately 500 nm thick, is formed over the entire surface.

Figure 3B:
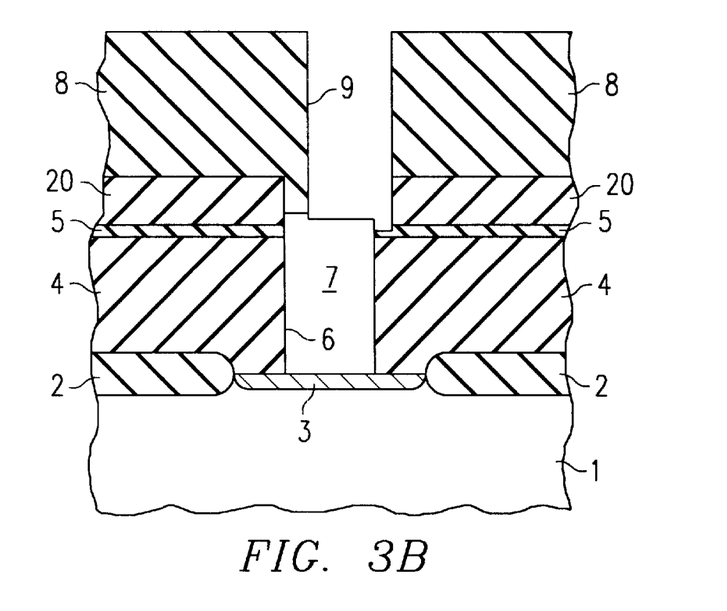

Next, as shown in FIG. 3b, silicon oxide film 8 is anisotropically etched, forming through-hole 9 that reaches contact plug 7. Note that, in the figure, a case where through-hole 9 is mis-positioned is shown, so through-hole 9 is also formed in silicon oxide film 20.

Figure 4A:
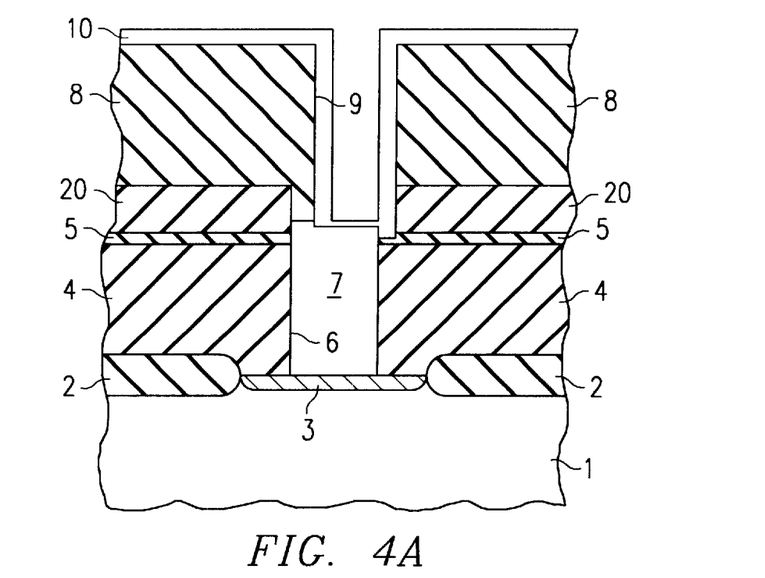
FIGS. 4a–4b are schematic cross section showing the manufacturing method, in process sequence, for a DRAM memory capacitor based on a first embodiment of this invention.

Next, as shown in FIG. 4a, low-resistance polysilicon film 10, approximately 150 nm thick, is formed over the entire surface, including the inner surface of through-hole 9.

Figure 4B:
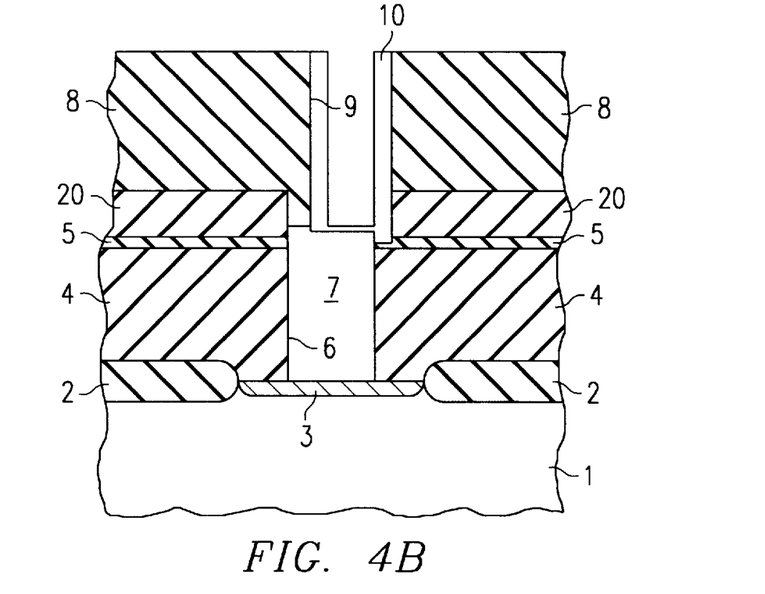

Next, as shown in FIG. 4b, polysilicon film 10 is etched back, essentially entirely removing polysilicon film 10 on silicon oxide film 8 outside of through-hole 9. By doing this, memory capacitor crown-type lower electrode (storage node) 10, made of this low-resistance polysilicon, is formed in through-hole 9.

Figure 5A:
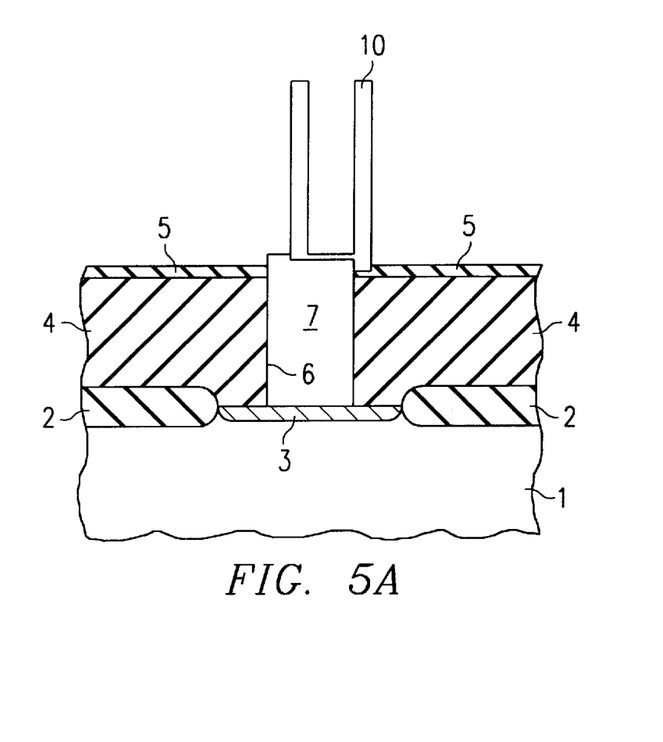
FIGS. 5a–5b are schematic cross section showing the manufacturing method, in process sequence, for a DRAM memory capacitor based on a first embodiment of this invention.

Next, as shown in FIG. 5a, silicon oxide film 8 and silicon oxide film 20 are essentially entirely removed by wet etching using an aqueous solution of HF. At this time, silicon nitride film 5 functions as an etching stopper. In addition, as shown, contact plug 7 is formed projecting, so underlying silicon oxide film 4 will not be etched inadvertently.

Figure 5B:
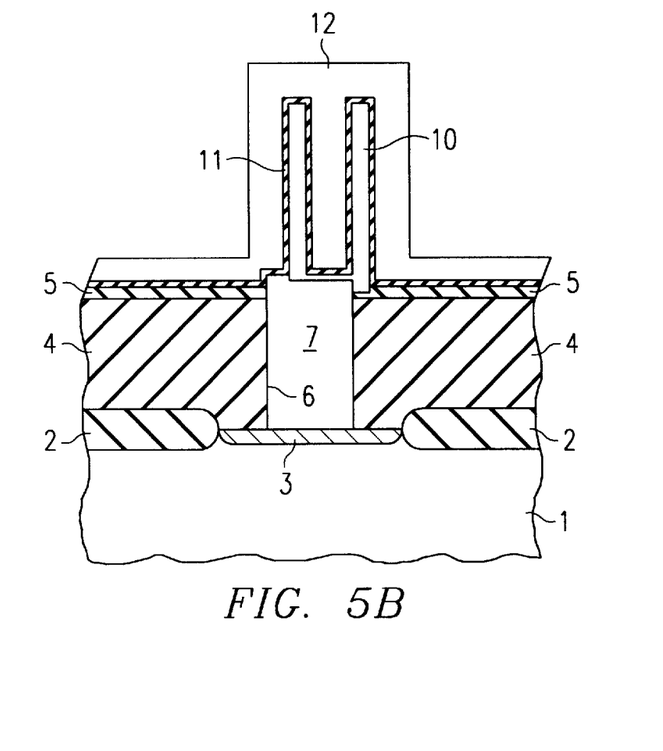

Next, as shown in FIG. 5b, capacitor dielectric film 11, approximately 5 nm thick, made of a stacked film of silicon nitride and silicon oxide (NO composite film), or $Ta_2O_5$, BST, or PZT, for example, is formed to cover the surface of storage node 10, and memory capacitor upper electrode (cell plate) 12, made of low-resistance polysilicon film, approximately 250 nm thick, is further formed on that.

A crown-type memory capacitor structure is formed using the processes above.

In this way, with this embodiment, contact plug 7 is formed essentially projecting upward above silicon oxide film 4, and preferably projecting upward above silicon nitride film 5 too, so silicon oxide film 4 is not exposed on the side surface of contact hole 6. Thus, silicon oxide film 4 is not inadvertently etched during subsequent wet etching. Furthermore, the method in this embodiment can be implemented extremely simply just by adding the process where silicon oxide film 20 is formed to the conventional method already discussed.

Second Embodiment

Next, referring to FIGS. 6–8, a second embodiment of this invention will be explained.

Figure 6A:
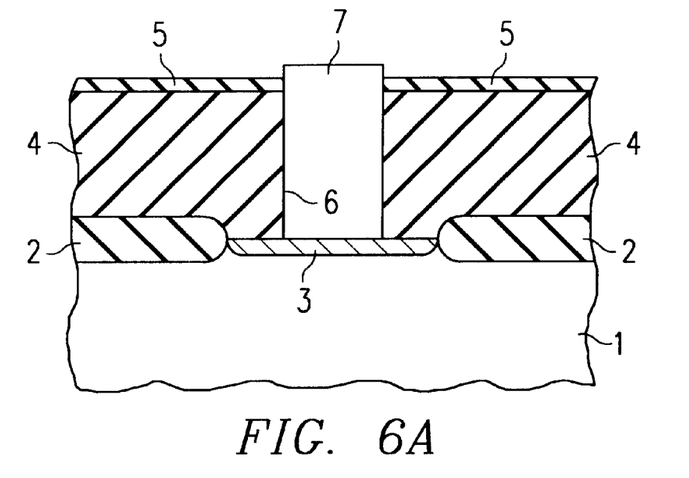
FIGS. 6a–6b are schematic cross section showing the manufacturing method, in process sequence, for a DRAM memory capacitor based on a second embodiment of this invention.

With this second embodiment, after the process shown in FIG. 2b of the aforementioned first embodiment, as shown in FIG. 6a, silicon oxide film 20 is essentially entirely removed.

Figure 6B:
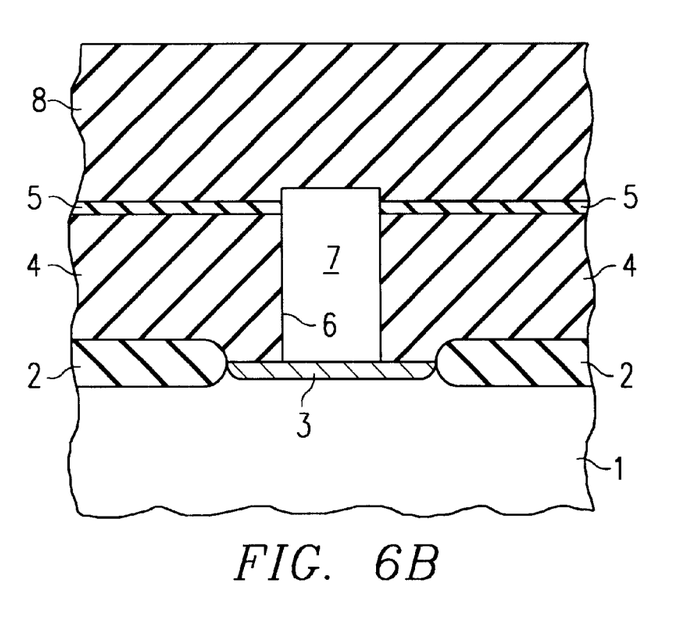

Next, as shown in FIG. 6b, silicon oxide film 8, approximately 800 nm thick, is formed over the entire surface.

Figure 7A:
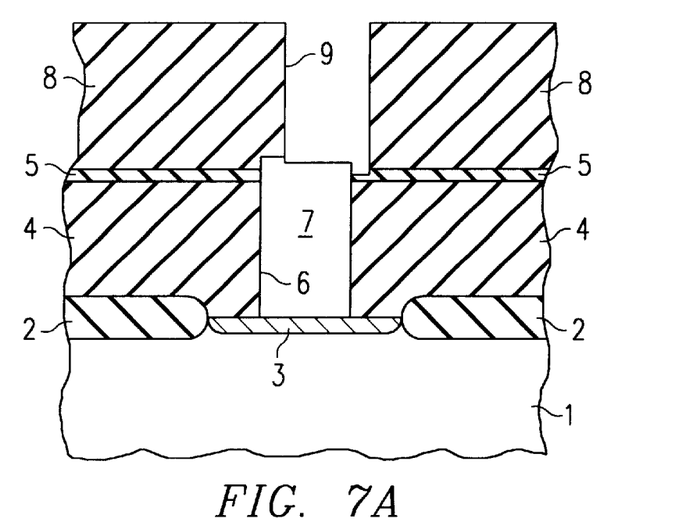
FIGS. 7a–7b are schematic cross section showing the manufacturing method, in process sequence, for a DRAM memory capacitor based on a second embodiment of this invention.

Next, as shown in FIG. 7a, silicon oxide film 8 is anisotropically etched, forming through-hole 9 that reaches to contact plug 7. In the figure, of course, a case where through-hole 9 is mis-positioned is shown.

Figure 7B:
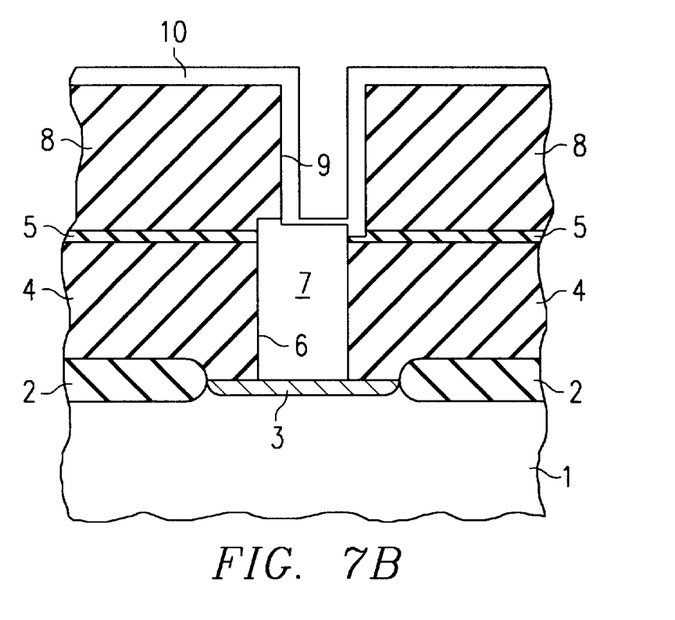

Next, as shown in FIG. 7b, as in the aforementioned first embodiment, low-resistance polysilicon film 10 is formed over the entire surface, including the inner surface of through-hole 9.

Figure 8A:
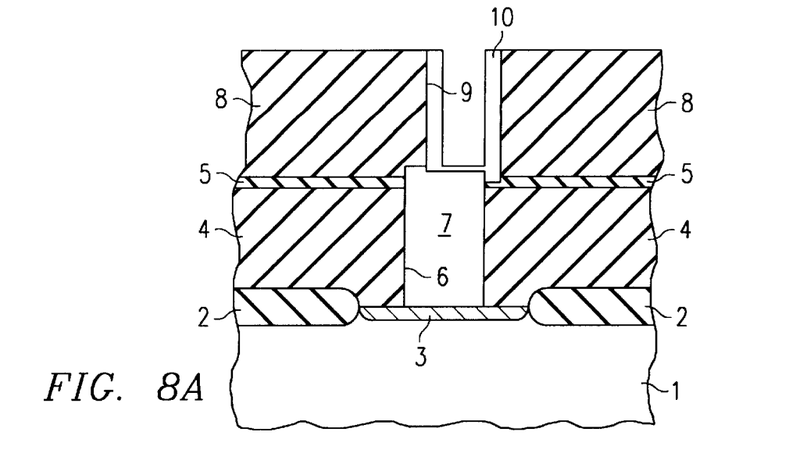
FIGS. 8a–8b are schematic cross section showing the manufacturing method, in process sequence, for a DRAM memory capacitor based on a second embodiment of this invention.

Next, as shown in FIG. 8a, polysilicon film 10 is etched back, essentially entirely removing polysilicon film 10 on silicon oxide film 8 outside of through-hole 9. By doing this, memory capacitor crown-type lower electrode (storage node) 10, made of this low-resistance polysilicon, is formed in through-hole 9.

Figure 8B:
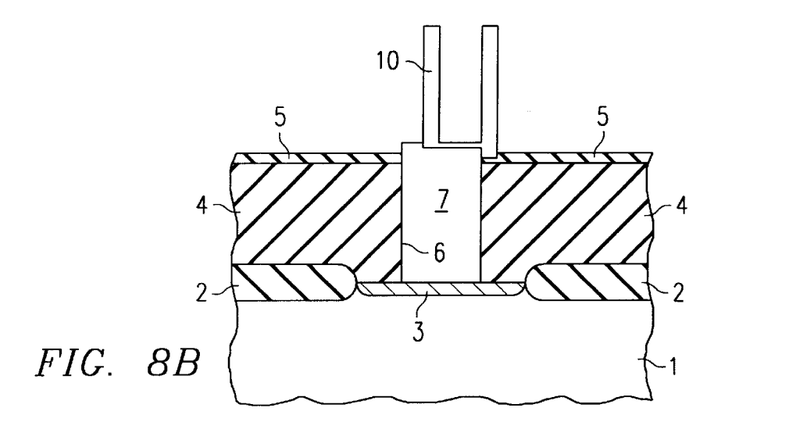

Next, as shown in FIG. 8b, silicon oxide film 8 is essentially entirely removed by wet etching using an aqueous solution of HF. At this time, silicon nitride film 5 functions as an etching stopper. In addition, as shown, contact plug 7 is formed projecting, so underlying silicon oxide film 4 is not inadvertently etched.

After this, while omitted from the figure, like the aforementioned first embodiment, the capacitor dielectric film and memory capacitor upper electrode (cell plate) are formed sequentially, and the memory capacitor structure is completed.

With this second embodiment too, like the aforementioned first embodiment, silicon oxide film 4 is not exposed at the side surface of contact hole 6, and thus silicon oxide film 4 is not inadvertently etched during subsequent wet etching.

Figure 9:
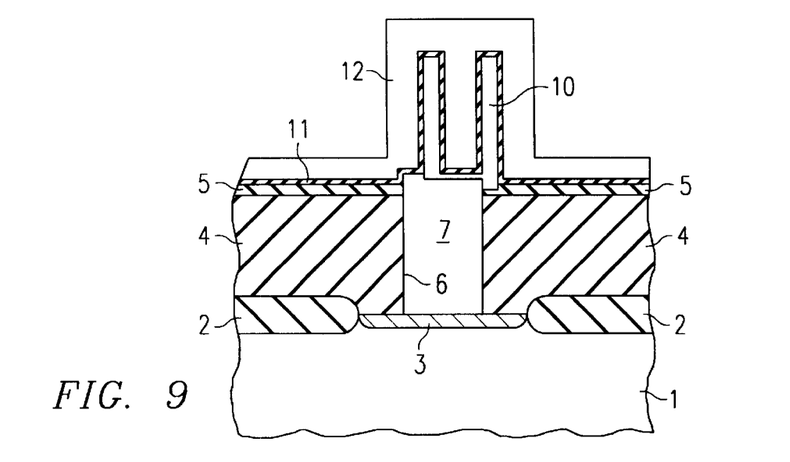
FIG. 9 is a schematic cross section showing an example of this invention applied to a stacked-type capacitor.

Above, embodiments where this invention is applied to a memory capacitor that has a crown-type storage node were explained, but this invention can be applied, in the same way, to a memory capacitor that has a stacked-type storage node 10', as shown in FIG. 9, for example.

In this invention, when, for example, a DRAM memory capacitor storage node is formed on an insulator layer, and this storage node and an impurity diffusion layer formed on the semiconductor substrate are connected by a contact plug structure, the contact plug is formed projecting upward above the aforementioned insulator layer. So even in cases where one side of the storage node is approximately equal to the diameter of the contact plug, the underlying insulator layer can be prevented from being inadvertently etched by wet etching when the storage node is formed.

What is claimed is:

1. Semiconductor memory device comprising,
    a semiconductor substrate provided with an impurity diffusion layer in a prescribed place in the surface region;
    a first insulator layer provided on the semiconductor substrate;
    a second insulator layer formed on top of the first insulator layer, said second insulator layer being of a different material than the first insulator layer;
    a contact hole provided in the first and second insulator layers in a position on the impurity diffusion layer;
    a contact plug that buries the contact hole and that is provided projecting upward above the first and second insulator layers and in contact with the second insulator layer, the contact plug having a top surface;
    a memory capacitor lower electrode that is provided on the second insulator layer and connected to the contact plug, at least a portion of said memory capacitor lower electrode is in direct contact with said contact plug top surface;
    a capacitor dielectric film provided on the surface of the lower electrode;
    and a memory capacitor upper electrode provided on the capacitor dielectric film.

2. Semiconductor memory device described in claim 1 wherein an indented section is formed in the top surface of the lower electrode to constitute a crown-type memory capacitor.

3. The semiconductor memory of claim 1 wherein the capacitor dielectric film is chosen from the group consisting of NO composite film, $T_{a2}O_3$, BST and PZT.

4. The semiconductor memory of claim 2 wherein the capacitor dielectric film is chosen from the group consisting of NO composite film, $T_{a2}O_3$, BST and PZT.

5. The semiconductor memory of claim 2 wherein the lower electrode is made of polysilicon.

6. The semiconductor memory of claim 1 wherein said first insulator layer is silicon dioxide.

7. The semiconductor memory of claim 1 wherein said second insulator layer is silicon nitride.

8. The semiconductor memory of claim 6 wherein said second insulator layer is silicon nitride.

9. The semiconductor memory of claim 1 wherein the lower electrode is made of polysilicon.

10. The semiconductor memory of claim 3 wherein the lower electrode is made of polysilicon.

11. The semiconductor memory of claim 4 wherein the lower electrode is made of polysilicon.

12. The semiconductor memory of claim 6 wherein the lower electrode is made of polysilicon.

13. The semiconductor memory of claim 7 wherein the lower electrode is made of polysilicon.

14. The semiconductor memory of claim 8 wherein the lower electrode is made of polysilicon.

* * * * *